(12) United States Patent
Abbott et al.

(10) Patent No.: US 8,035,464 B1
(45) Date of Patent: Oct. 11, 2011

(54) BONDED WAFER SAW FILTERS AND METHODS

(75) Inventors: Benjamin P. Abbott, Longwood, FL (US); Robert Aigner, Ocoee, FL (US); Julien Gratier, Apopka, FL (US); Taeho Kook, Orlando, FL (US)

(73) Assignee: Triquint Semiconductor, Inc., Orlando, FL (US)

( * ) Notice: Subject to any disclaimer, the term of this patent is extended or adjusted under 35 U.S.C. 154(b) by 296 days.

(21) Appl. No.: 12/398,711

(22) Filed: Mar. 5, 2009

(51) Int. Cl.
*H03H 9/64* (2006.01)
(52) U.S. Cl. ............... 333/193; 333/194; 310/313 B
(58) Field of Classification Search .......... 333/151, 333/155, 193–196; 310/313 R, 313 B, 313 C, 310/313 D
See application file for complete search history.

(56) References Cited

U.S. PATENT DOCUMENTS

| | | | | |
|---|---|---|---|---|
| 4,234,859 A | * | 11/1980 | Ikushima et al. | ............. 333/151 |
| 4,364,017 A | * | 12/1982 | Tokunaga et al. | ............. 333/194 |
| 4,494,091 A | * | 1/1985 | Goll | ............. 333/151 |
| 4,500,807 A | * | 2/1985 | Yuhara et al. | ............. 310/313 B |
| 5,998,907 A | | 12/1999 | Taguchi et al. | |
| 6,037,847 A | | 3/2000 | Ueda et al. | |
| 6,556,104 B2 | | 4/2003 | Naumenko et al. | |
| 7,105,980 B2 | | 9/2006 | Abbott et al. | |

FOREIGN PATENT DOCUMENTS

| | | | | |
|---|---|---|---|---|
| JP | 56-152316 | * | 11/1981 | ............. 333/155 |
| JP | 9-98055 | * | 4/1997 | |
| JP | 2003-142985 | * | 5/2003 | |

* cited by examiner

*Primary Examiner* — Barbara Summons
(74) *Attorney, Agent, or Firm* — Allen, Dyer, Doppelt, Milbrath & Gilchrist, P.A.

(57) ABSTRACT

Improved coupling coefficients and desirable filter characteristics are exhibited in a SAW filter including an electrode pattern deposited on a piezoelectric substrate bonded directly to an anti-reflective layer, wherein the anti-reflective layer is bonded to a carrier through an adhesive layer such that a preselected thickness of the anti-reflective layer is sufficient for enhancing an acoustic match between the piezoelectric substrate and the adhesive layer.

20 Claims, 17 Drawing Sheets

BONDED WAFER SAW FILTERS AND METHODS

FIELD OF INVENTION

The present invention relates to surface acoustic wave devices, and in particular to surface acoustic wave filters having improved coupling coefficients while maintaining desirable filter characteristics.

BACKGROUND OF THE INVENTION

Surface acoustic wave (SAW) filters typically comprise interdigital transducer elements deposited on a piezoelectric substrate. SAW filters are widely used in various telecommunication systems due to small size, low loss characteristics of the implemented SAW resonators. SAW filter performance is generally dependent upon the features of the piezoelectric substrate. Low loss, smooth broadband, good rejection and sharp shape factor filter characteristics may be achieved by providing a piezoelectric substrate which exhibits high coupling coefficient, temperature compensation, high resonant Q factor and strong suppression of plate modes. Lithium Tantalate (LT) and Lithium Niobate (LN) substrates exhibit a high coupling coefficient. Rotated Y-cuts of LT exhibit coupling coefficient in the range of 8% to 10% and have been described by Ueda et al. in U.S. Pat. No. 6,037,847 and by Naumenko et al. in U.S. Pat. No. 6,556,104, the disclosures of which are herein incorporated by reference in their entirety. The coupling coefficient of LN has been shown to exhibit a coupling coefficient as high as 23%. However, these high coupling piezoelectric substrates typically exhibit an undesirably significant temperature drift.

Two approaches have been investigated to reduce the temperature drift of the high coupling substrates by bonding the high temperature coefficient expansion piezoelectric substrate to a low temperature coefficient expansion substrate. Taguchi et al. in U.S. Pat. No. 5,998,907, the disclosure of which is herein incorporated by reference in its entirety disclose a number of bonded SAW device structures for purpose of temperature compensation. Taguchi discloses combining two piezoelectric layers with one layer bonded directly to a second layer having a lower temperature coefficient of expansion (TCE). In another embodiment disclosed by Taguchi comprises of a thin film insulation layer of silicon dioxide of 1000 Angstrom joined directly with the piezoelectric substrate and a TCE carrier of Si for purpose of temperature compensation. While attempts to control temperature characteristics are sought, structures as proposed above lead to spurious and undesirable responses due to a direct capacitance coupling between the electrode pattern and carrier, typically a Silicon material. This results in a poor filter performance characteristics.

Abbott et al in U.S. Pat. No. 7,105,980 discloses a SAW composite device comprising a piezoelectric substrate, a surrogate carrier and a bonding film securing the piezoelectric substrate to the carrier wherein the bonding film is a silicon oxide layer with at least one micron thickness to reduce capacitance coupling.

Other known embodiments include bonded wafer SAW filters in which the piezoelectric substrate is bonded with an adhesive layer to a lower temperature coefficient expansion carrier wafer. The TCE material used may be Si or alumina. Unfortunately, and as will be detailed late in this specification, such device structures produce plate mode resonances that distort the response of the resonators. There is a need to overcome this disadvantage.

SUMMARY OF THE INVENTION

In view of the foregoing background and in keeping with the teachings of the present invention, a SAW filter may comprises an electrode pattern deposited on a piezoelectric substrate bonded directly to an anti-reflective layer, wherein the anti-reflective layer is bonded to a carrier through an adhesive layer.

One SAW filter may be described as comprising a piezoelectric substrate having first and second opposing surfaces, an electrode pattern deposited on the first surface of the piezoelectric substrate, an anti-reflective layer directly bonded to the second surface of the piezoelectric substrate, a carrier substrate, and an adhesive material securing the anti-reflective layer to the carrier substrate, wherein the anti-reflective layer is used for enhancing an acoustic match from the piezoelectric substrate to the adhesive layer.

The anti-reflective layer may comprise a layer of Silicon, Silicon Oxide, Aluminium Oxide, or a combination thereof. Yet further, the anti-reflective layer may comprise a Silicon Oxide layer having a thickness greater than 1.5 microns. The Silicon Oxide layer may comprise a thickness substantially equally to 1.8 microns+n*(5.2), where n takes on zero and positive integer values. Additionally, the anti-reflective layer having the characteristics exhibiting an acoustic impedance and wave velocity that lie between that of the piezoelectric substrate and the adhesive layer. The piezoelectric substrate may be Lithium Tantalate or Lithium Niobate. The adhesive layer may be glue, resinous material or an epoxy.

BRIEF DESCRIPTION OF THE DRAWINGS

Embodiments of the invention are described, by way of example, with reference to the accompanying drawings in which.

DETAILED DESCRIPTION OF THE PREFERRED EMBODIMENTS

The present invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
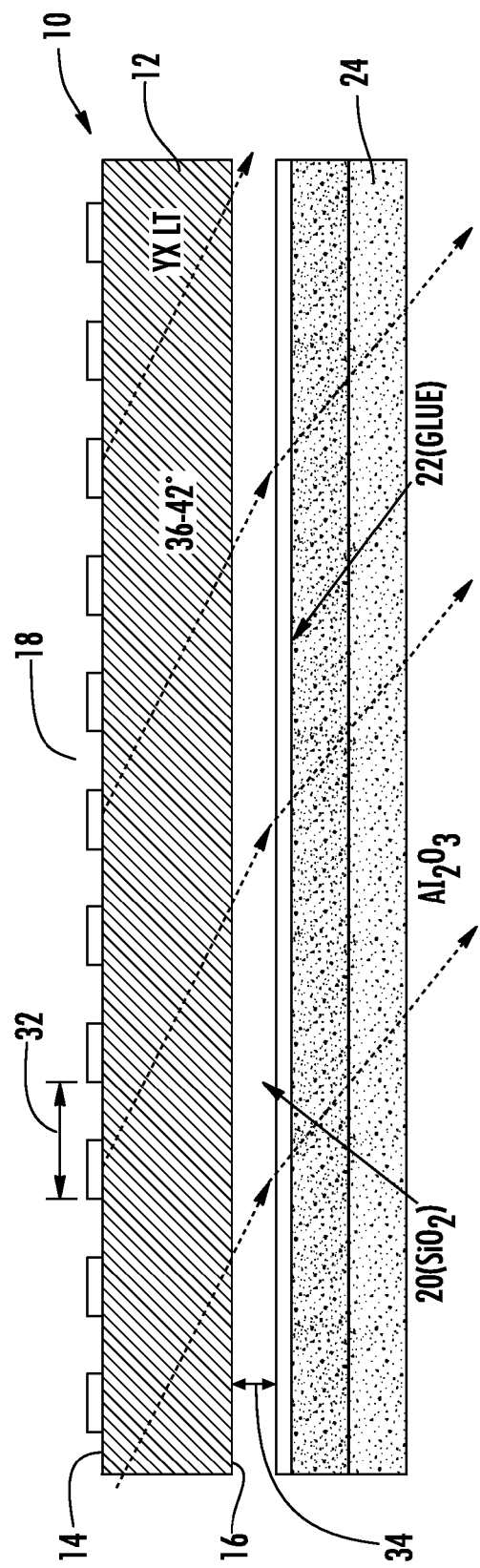
FIG. 1 is a partial cross sectional view of one acoustic filter in keeping with the teachings of the present invention.

With reference initially to FIG. 1, One embodiment of the present invention may be described as a SAW filter 10 comprising a piezoelectric substrate 12 having first and second opposing surfaces 14, 16, respectively, with an electrode pattern 18 deposited on the first surface 14 of the piezoelectric substrate 12. An anti-reflective layer 20 is bonded directly to the second surface 16 of the piezoelectric substrate 12. An adhesive material 22 secures the anti-reflective layer 20 to a carrier substrate 24. The anti-reflective layer 20 is such that an acoustic match from the piezoelectric substrate 12 to the adhesive layer 22 is enhanced.

Figure 2:
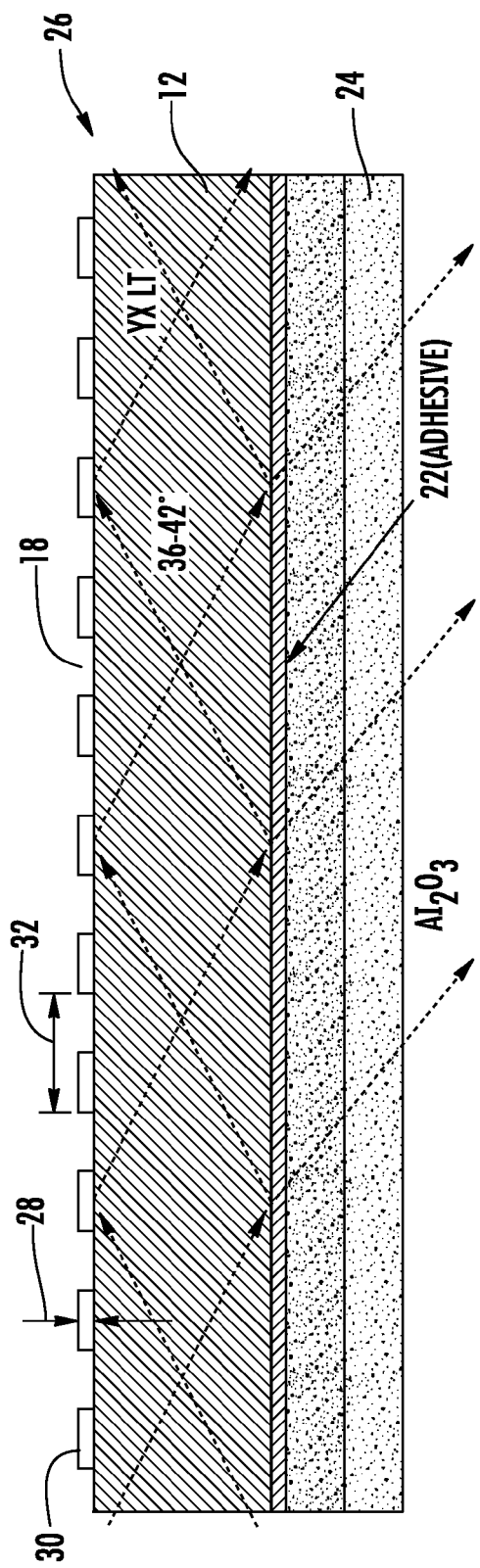
FIG. 2 is a partial cross sectional view of a known acoustic wave filter.
Figure 3:
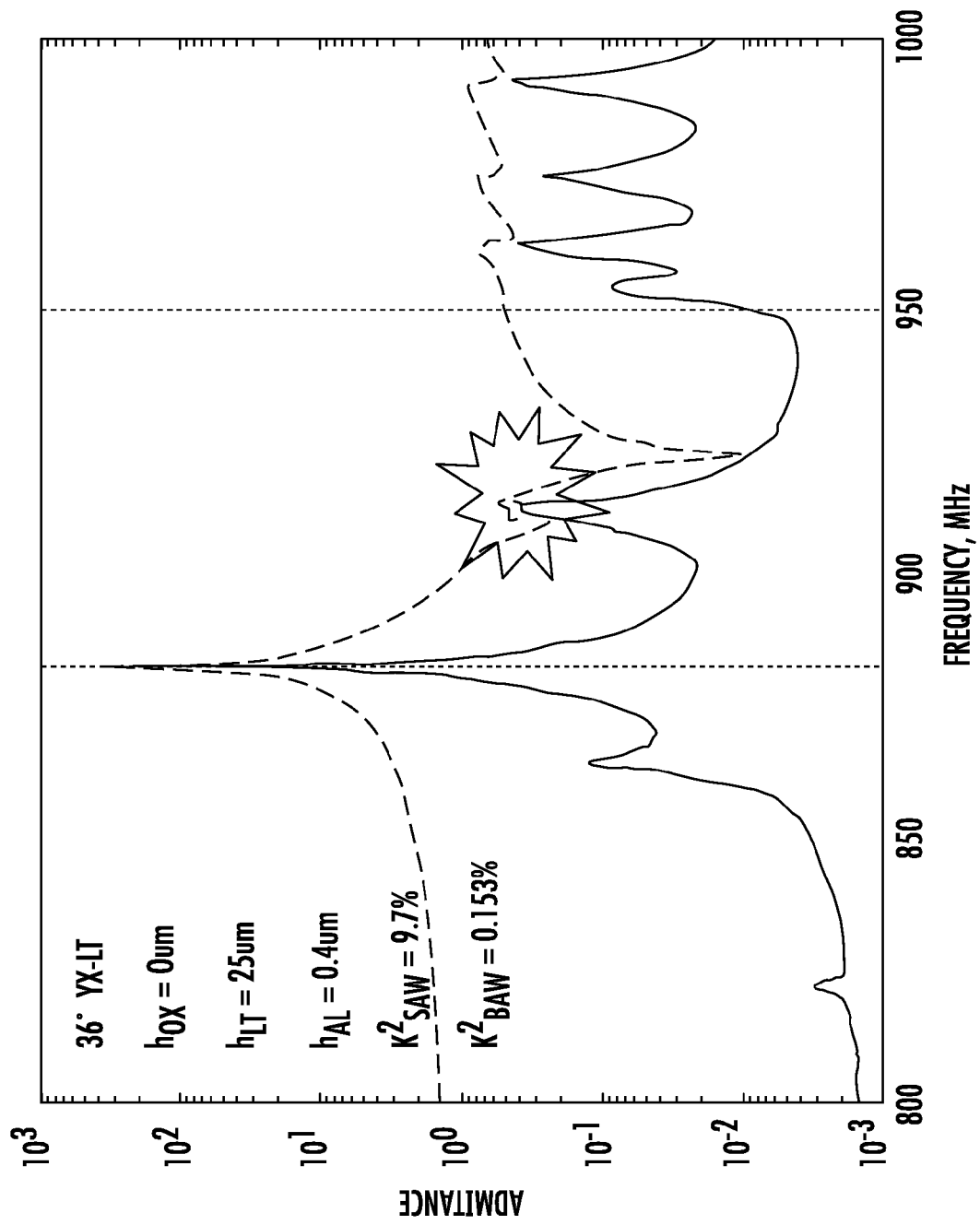
FIG. 3 illustrates spurious results in the filter of FIG. 2 as a result of plate modes.

Before continuing with details regarding features of the embodiment herein presented by way of example, and for an better appreciation of problems in the art solved by the present invention, consider one known embodiment of a bonded wafer SAW filter 26 in which the piezoelectric substrate 12 is bonded with an adhesive layer 22 to a lower temperature coefficient expansion carrier wafer 24, as illustrated with reference to FIG. 2. The TCE material used may be Si or alumina. Such device structures produce plate mode resonances that distort the response of the resonators. By way of example, FIG. 3 illustrates results of an analysis exhibiting spurious responses due to the plate modes for the filter 24 of FIG. 2. By way of example, any plate mode resonances in the frequency range between the dashed (---) vertical lines will produce distortion in the passband frequency range of the filter.

Figure 4C:
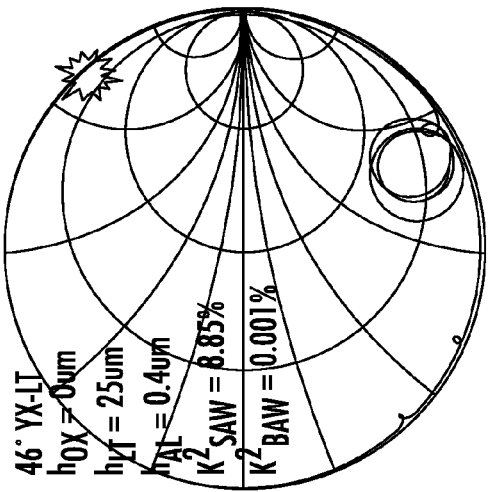
FIGS. 4a, 4b and 4c illustrate a variation in plate mode suppression for different Y-rotations in a Lithium Tantalate substrate used with a filter as illustrated in FIG. 2.
Figure 4B:
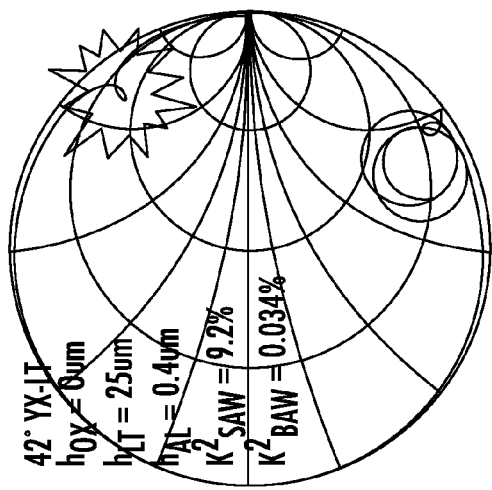
Figure 4A:
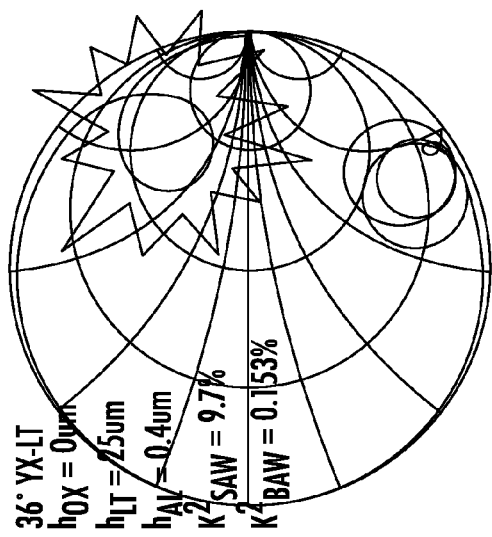
Figure 5B:
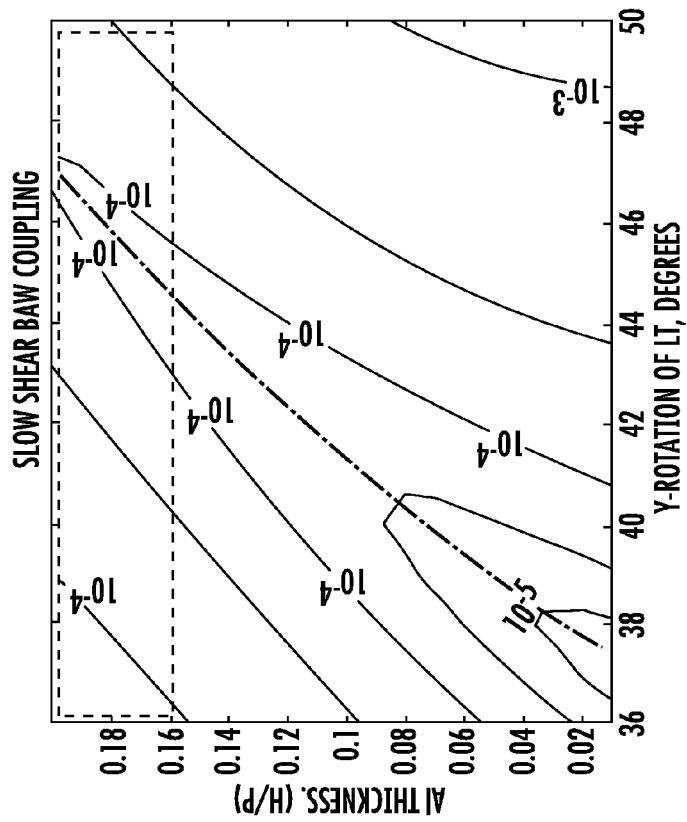
FIGS. 5a and 5b illustrate variations of a leaky SAW (LSAW) coupling and slow shear bulk acoustic wave (BAW) coupling, respectively, for various electrode thicknesses and cut angle of Lithium Tantalate.
Figure 5A:
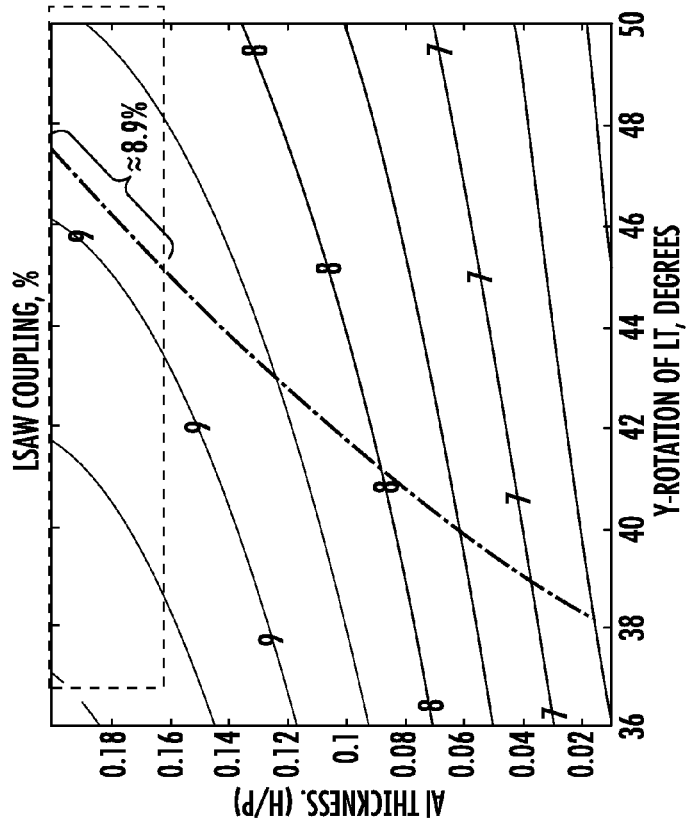

The degree to which the plate modes distort the response of the resonators is dependent upon multiple physical factors. Two prominent factors are metal thickness 28 of the electrodes 30 and the angle Y-rotation of the substrate 12. Known devices show much evidence as to what the thicknesses of the electrodes must be in order to obtain high performance SAW resonators on Y-rotations of LT and LN. For example, for 36-48° Y rotated LT the relative thickness of Al electrodes 30 is generally in the range of 0.16<h/p<0.22 where h is the thickness 28 and p is the periodicity 32. By way of example, FIGS. 4*a*, 4*b* and 4*c* illustrate a variation of the plate mode suppression for different Y-rotations of LT (36°, 42°, and 46° respectively). As the Y-rotation is varied from an angle of 36° to 46°, the effect of the plate mode is modulated. For a metal thickness of h/p=0.18 the coupling to the plate mode's effect reaches a minimum at about 46° Y-rotated X propagation Lithium Tantalate. By way of further example, FIGS. 5*a* and 5*b* illustrate variations of a leaky SAW (LSAW) coupling and slow shear BAW coupling, respectively, for various electrode thicknesses and cut angle of LT. The modulation of the plate mode is a result of the variation of its piezoelectric coupling coefficient. Both the piezoelectric coupling of the dominant leaky surface acoustic wave modes and the plate modes are affected by the Y-rotation of the piezoelectric substrate. Practical devices in the prior art are generally found in the regions encompassed by the dashed (---) boxes providing a strong LSAW coupling coefficient and a weak slow shear BAW coupling. For practical devices to be constructed using the bonded wafer as disclosed, the Y-rotation of the LT is desirably restricted so as to provide sufficient suppression of the plate modes. With continued reference to FIG. 5*a*, this region lies in the vicinity of the dot-dash line. The overlap of regions of practical electrode thickness and lower coupling to the plate modes yield a piezoelectric coupling of about 8.9%. As compared to the common 9.5% piezoelectric coupling for h/p=0.18 for 42° LT, the 8.9% coupling coefficient can be an appreciable disadvantage. The lower coupling would result in higher loss and narrower bandwidth. There is clearly a need to overcome this disadvantage.

Figure 6:
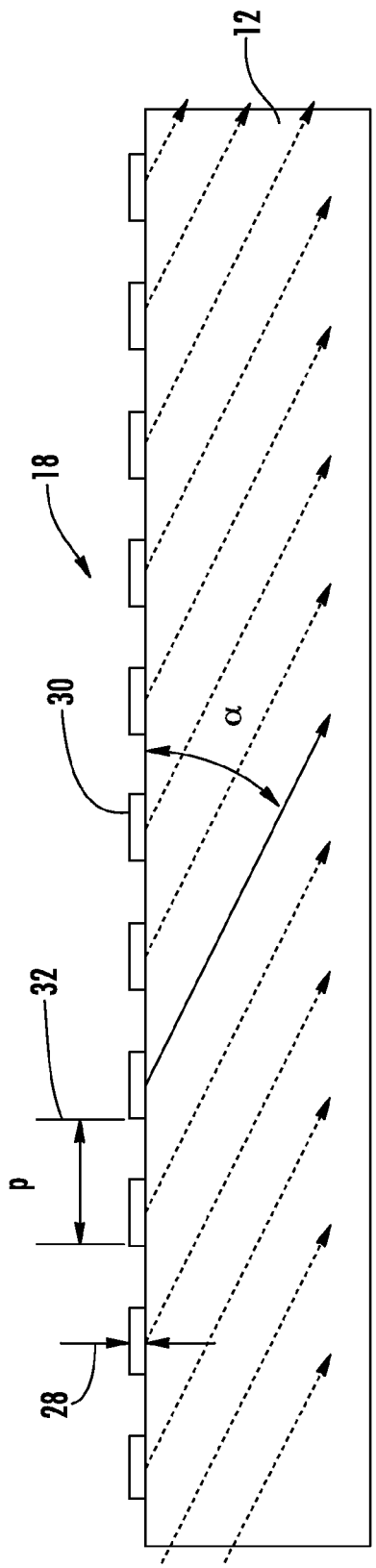
FIG. 6 is a partial cross sectional view illustrating electrodes deposited on a surface of a high coupling piezoelectric substrate in keeping with the teachings of the present invention.
Figure 7A:
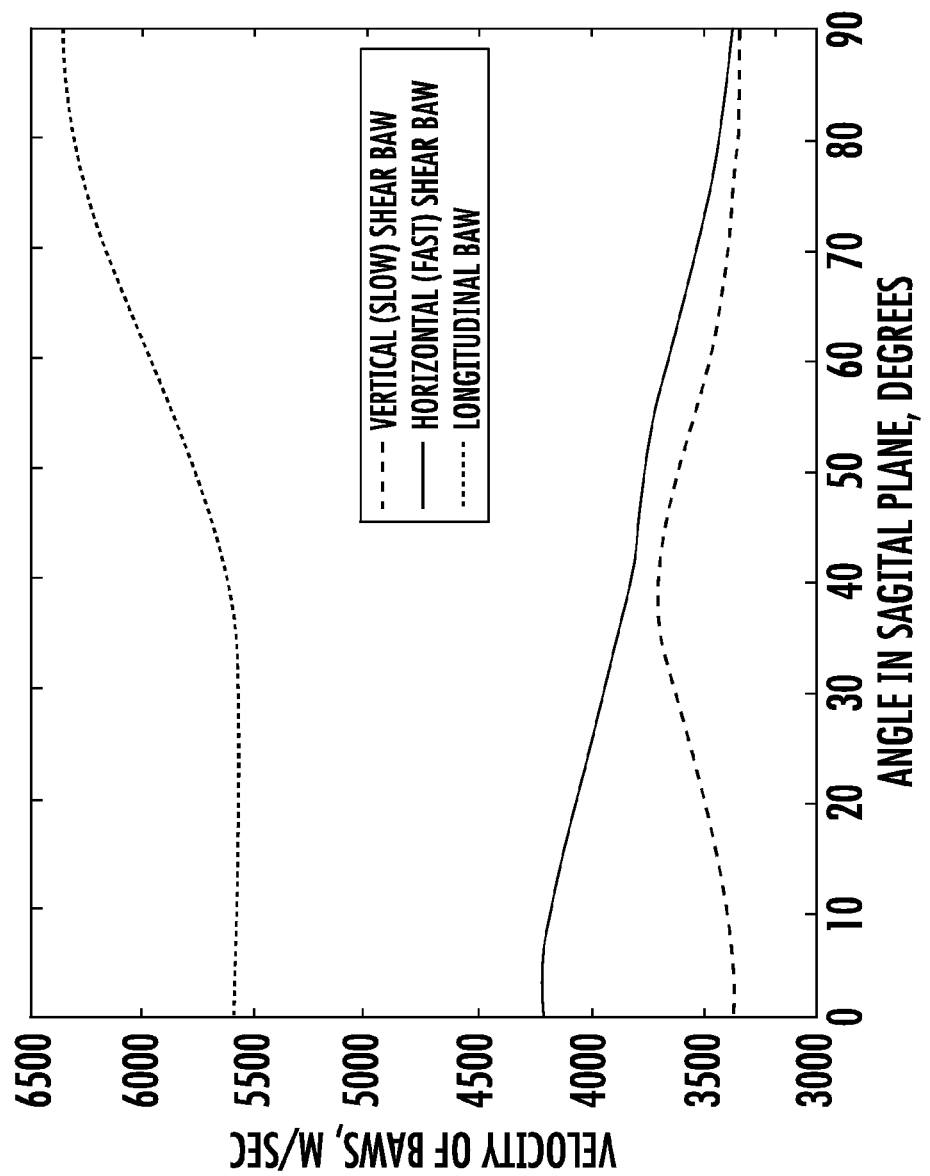
FIGS. 7a and 7b illustrate velocity as a function of angle, and angle as a function of frequency for three BAW modes.
Figure 7B:
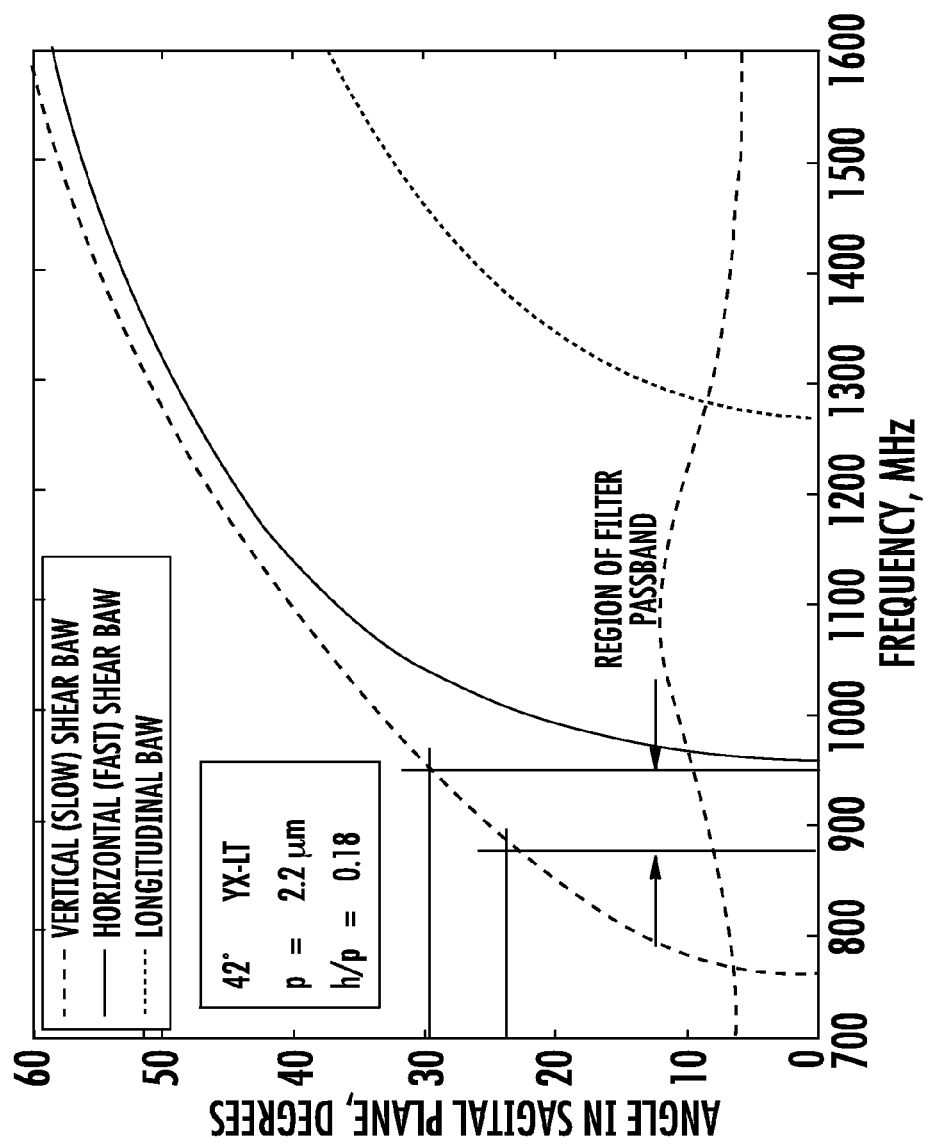
Figure 8:
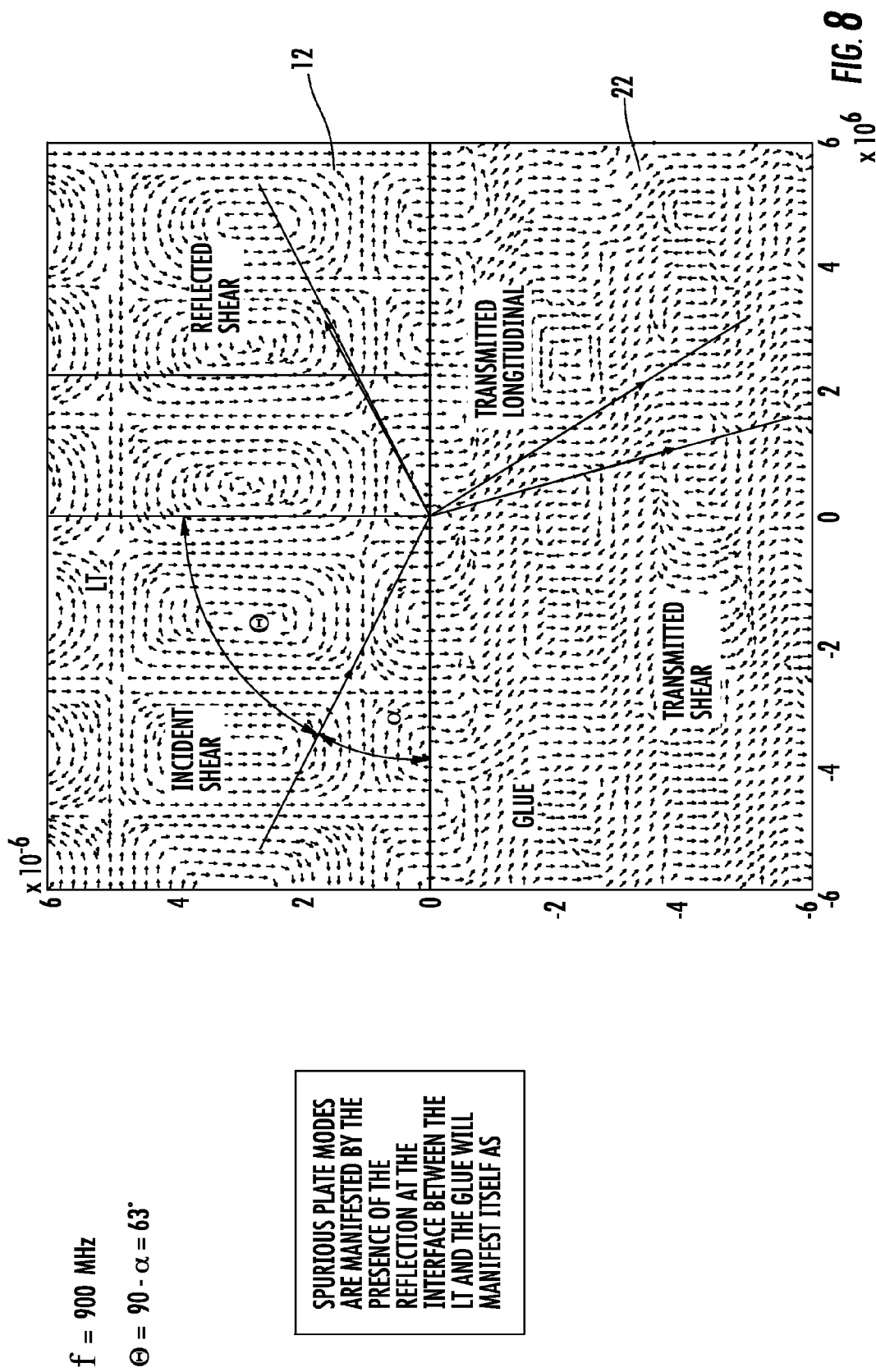
FIG. 8 diagrammatically illustrates shear waves incident at an interface of a Lithium Tantalate substrate an adhesive (glue) bonding to a carrier substrate along with resulting reflected shear and transmitted shear waves.

Referring again to FIG. 2, the filter 26 as described includes the electrode pattern 18 deposited on the piezoelectric substrate 12 bonded through an adhesive material/layer 22 to the carrier substrate 24. In contrast, the embodiment as illustrated with reference to FIG. 6 includes an array of electrodes 30 deposited on a high coupling piezoelectric substrate 12 such as lithium tantalate. The electrodes 30 shown have a periodicity (p) 32 with a thickness (h) 28. The angle ($\alpha$) at which a BAW propagates in the piezoelectric substrate 12 is dependent upon the electrode period 32, the velocity of the BAW, the frequency of excitation, and the type of BAW. The three types of BAW modes generated are vertical shear, horizontal shear and longitudinal shear. The velocities and angles of these three BAW modes are illustrated in the plots of FIGS. 7*a* and 7*b*. As illustrated, the vertical shear BAW mode propagates in the LT at an angle of 23° to 30° falling in the filter passband region can significantly degrade the performance of the filter. These shear waves will be incident at the interface of LT and adhesive (glue) bonding to the carrier substrate along with the resulted reflected shear and transmitted shear waves as illustrated with reference to FIG. 8.

For LSAW devices on YX orientations of LT, the shear wave transmission into the adhesive material 22 or glue is relatively weak while the reflected shear wave is relatively strong. As adhesive materials 22, such as glues and/or epoxies, have low acoustic impedances and low acoustic velocities, an interface between the piezoelectric substrate 12 or plate and the adhesive material 22 will produce large acoustic reflections which will result in the guiding of plate modes in the piezoelectric plate. These plate modes will produce spurious resonance which destructively interference with the desired SAW mode. Suppressing these reflections will result in suppressing the spurious plate modes. Embodiments of the invention provide methods and structures to reduce/suppress spurious acoustic modes which accompany the desired acoustic response of an IDT constructed on a thin piezoelectric plate which is adhesively bonded to a carrier substrate.

Figure 9A:
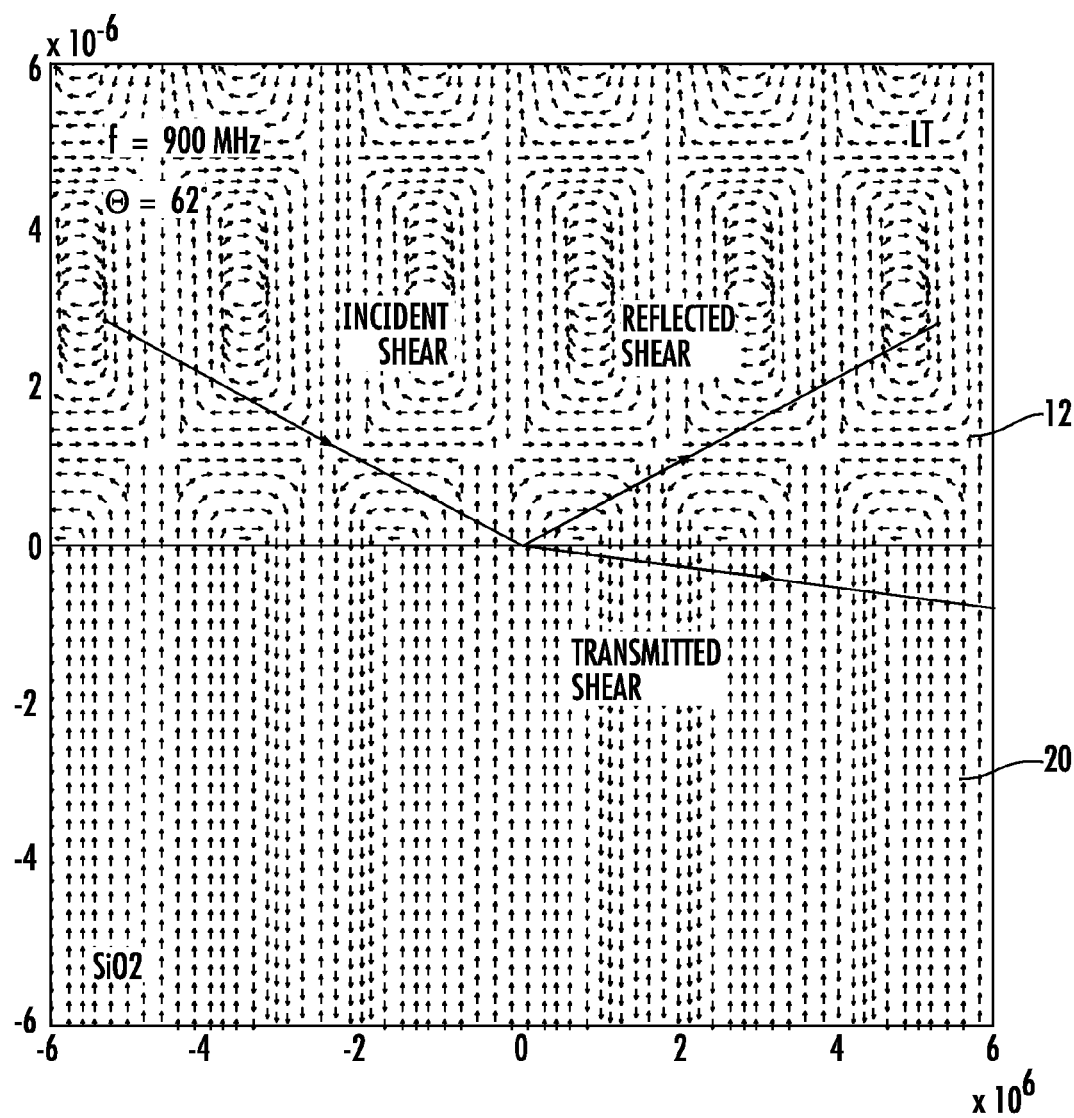
FIGS. 9a and 9b diagrammatically illustrate a wave pattern at an interface of Lithium Tantalate to a Silicon Oxide layer for various incident shear angles.
Figure 9B:
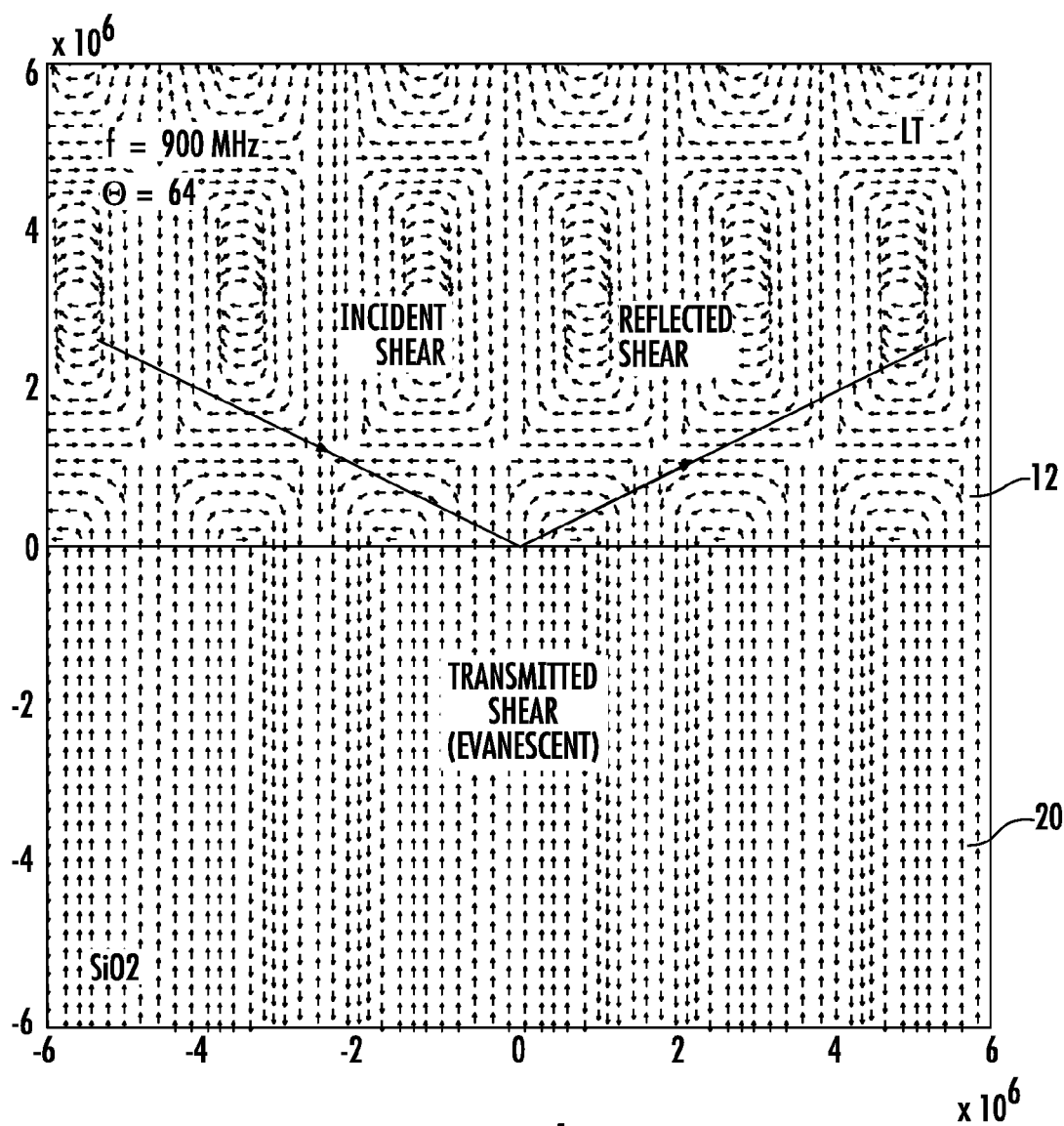
Figure 10A:
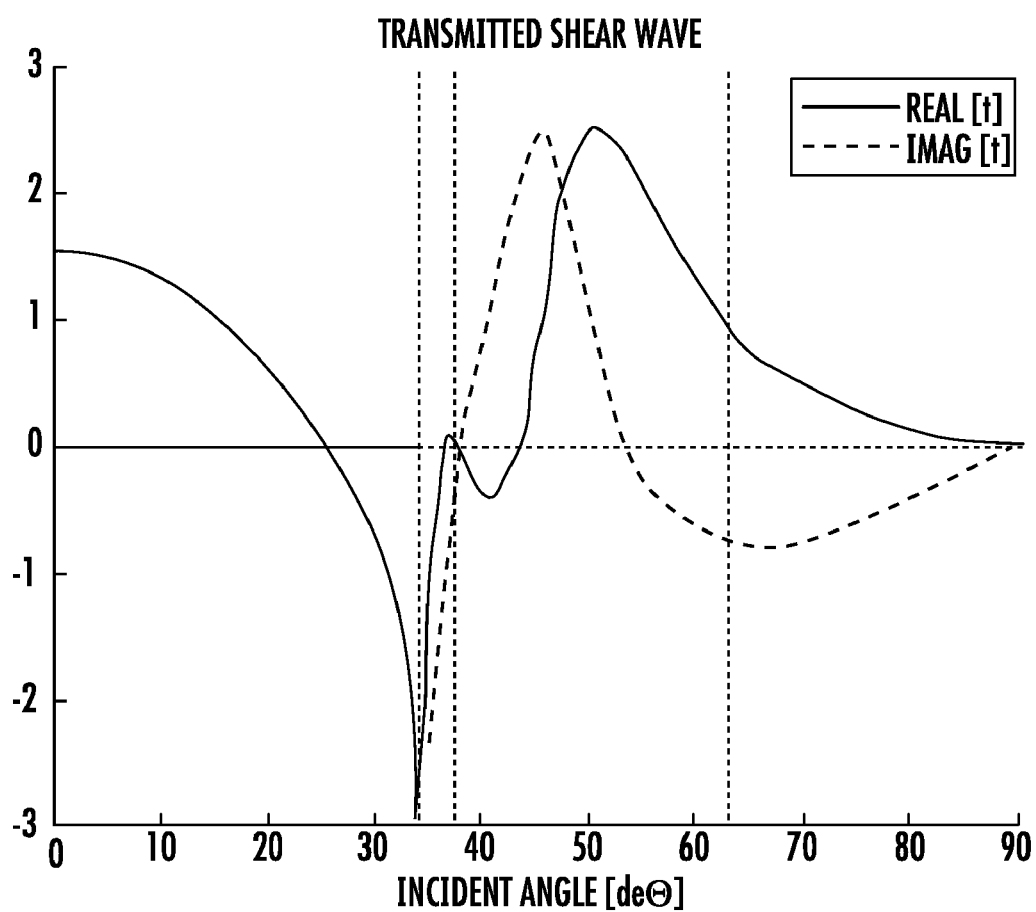
FIGS. 10*a* and 10*b* illustrate angles for shear wave transmission from Lithium Tantalate to $SiO_2$ and shear wave reflection at the interface, respectively.
Figure 10B:
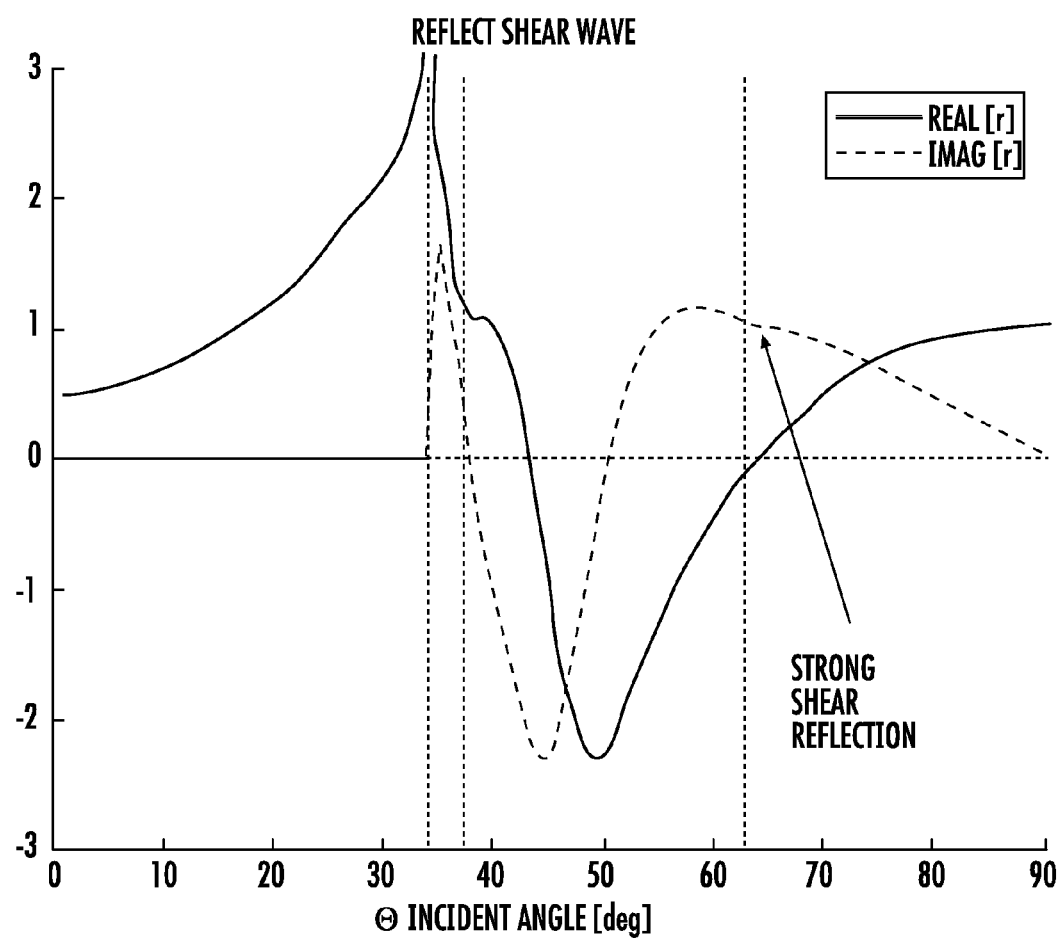
Figure 11:
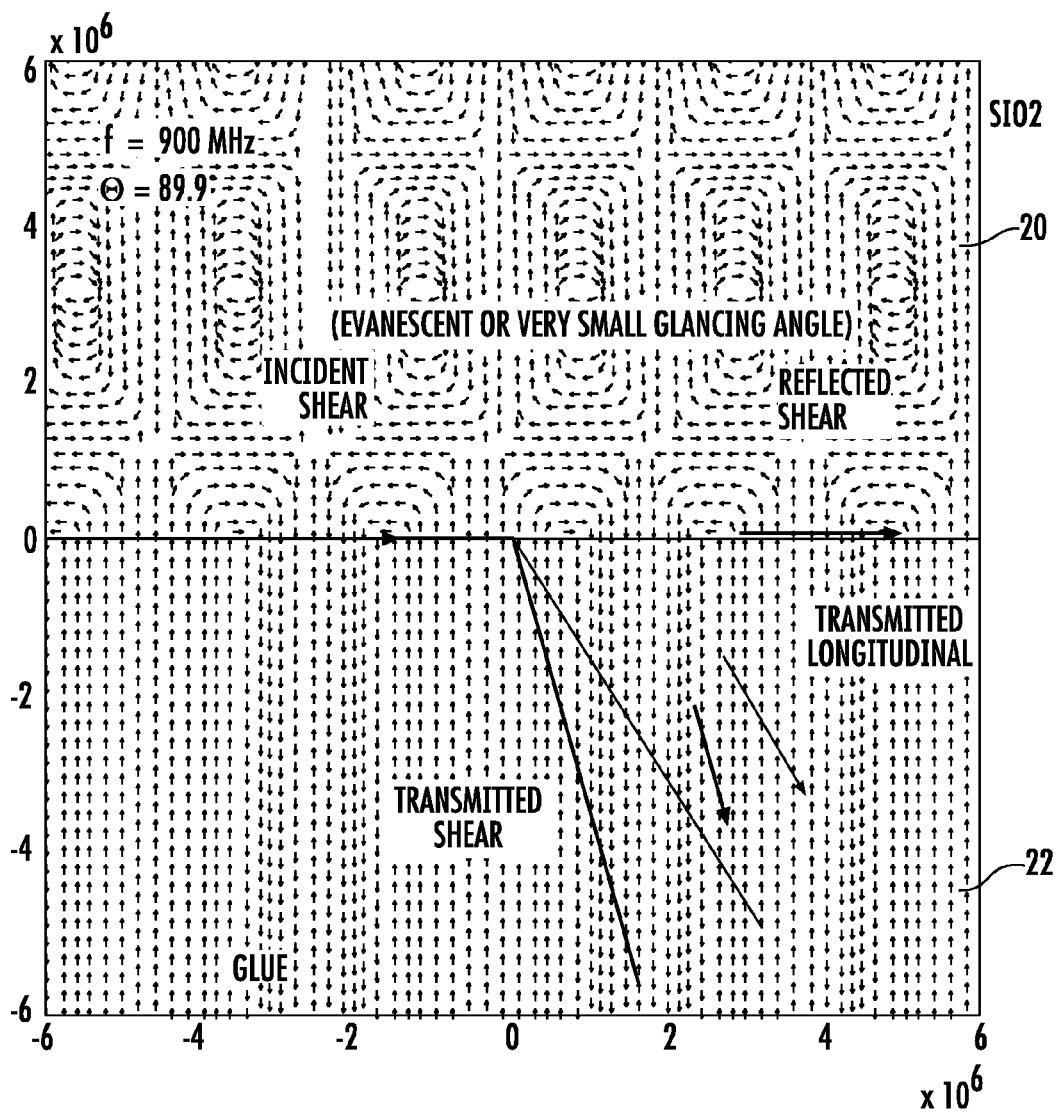
FIG. 11 diagrammatically illustrates a wave pattern at the interface of $SiO_2$ to a glue or adhesive layer.

With reference again to FIG. 1, to reduce or suppress the plate modes, it is desirable to form the anti-reflective layer 20 between the piezoelectric substrate (plate) 12 and the adhesive material 22. An additional layer of material is placed between the piezoelectric substrate (plate) 12 and the adhesive material 22. In order to result in a reduction or suppression of the acoustic reflections, this additional material preferably has an acoustic impedance and velocity that is generally half way between that of the piezoelectric plate and the adhesive. By way of example for the case of LiTaO3 or LiNbO3 substrates 12 and an epoxy adhesive 22, silicon oxide is an excellent candidate for this anti-reflective "intermediate" layer 20. The thickness 34 of this intermediate layer 20 is preferably selected so as to suppress the composite acoustic reflections. FIGS. 9a and 9b illustrate a wave pattern at an interface of LT (substrate 12) to silicon oxide layer (anti-reflective layer 20). At an incident angle of 62° off normal, the transmitted shear propagates downward from the interface at a slight angle. While at an incident angle of 64°, the transmitted shear is evanescent with a slow decay into the oxide layer. From these two illustrations of FIGS. 9a and 9b, it is evident that the critical angle for the shear wave reflection is approximately 63° at the interface between the LT and silicon oxide layer. As illustrated with reference to FIGS. 10a and 10b, the critical angles are clearly identified for shear wave transmission from LT to $SiO_2$ and shear wave reflection at the interface. By way of example, FIG. 11 illustrates a wave pattern at the interface of $SiO_2$ (anti-reflective layer 20) to the glue (adhesive material 22) and clearly illustrates that an intermediate layer of $SiO_2$ provides efficiently transmitting acoustic energy at small glancing angles into an acoustic field that steeply propagates downward into the glue.

As a result, one embodiment of the acoustic wave filter 10 having desirable characteristics as above described comprises the electrode pattern 18 deposited on a high coupling piezoelectric substrate 12 as described earlier with reference to FIG. 1. The piezoelectric substrate 12 may be lithium tantalate or lithium niobate. The piezoelectric substrate 12 is directly bonded to an anti-reflective coating layer 20. The anti-reflective layer 20 desirably results in an evanescent field that decays slowly with depth. The anti-reflective layer may be comprised of silicon oxide. The silicon oxide layer 20 is attached to a layer of glue 22 which is then attached to a carrier substrate 24, such as a ceramic including aluminum oxide as herein illustrated by way of example with reference again to FIG. 1. At the interface between the silicon oxide layer 20 and the glue 22, the evanescent field should efficiently convert into a downward propagating field. This results in a substantially reduced reflection of the acoustic energy incident from the LT and upon the lower layers. The cumulative effect is a substantial reduction in the distortions brought about by the spurious plate modes. Additionally, the anti-reflective layer 20 preferably has an acoustic impedance and/or wave velocity that is between that of the piezoelectric substrate 12 and that of the adhesive layer 22 thereby reducing the shear wave reflection. The thickness of the anti-reflective material is sufficient for enhancing an acoustic match between the piezoelectric substrate and adhesive layer.

By way of further example, the carrier substrate 24 may be the $Al_2O_3$ as above illustrated, Si, $SiO_2$, or any other material which meets the desirable requirements of a low TCE as compared to the piezoelectric substrate material, sufficient thickness and Young's Modulus so at to produce a compressional strain in the piezoelectric plate as the temperature is increased, and a tensile stress as the temperature is decreased.

Figure 12A:
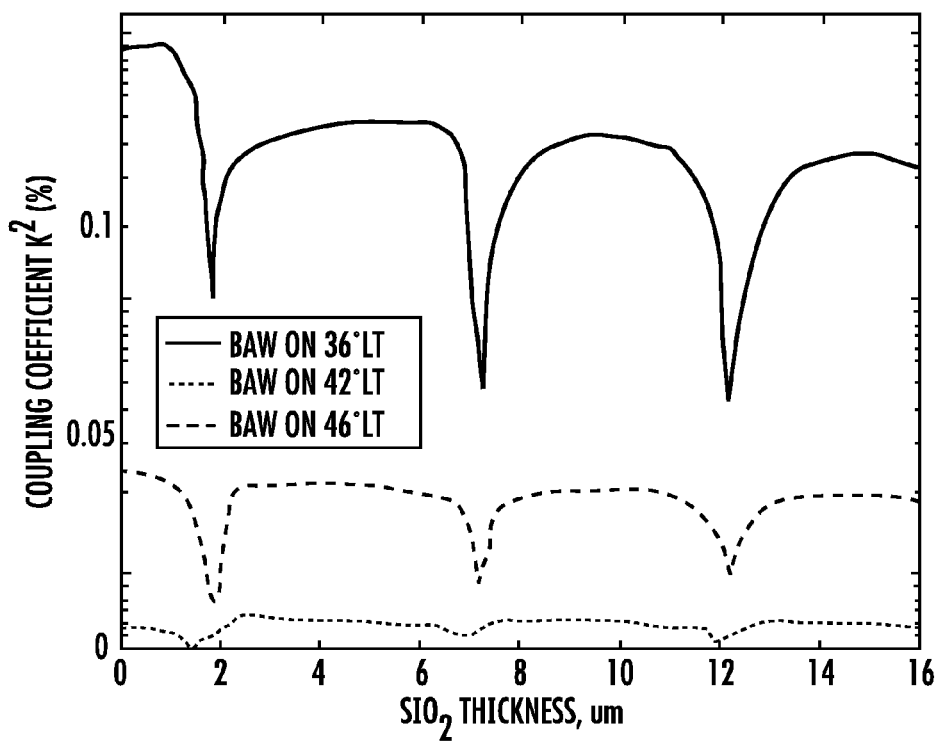
FIGS. 12*a* and 12*b* illustrates simulation results of a vertical shear BAW coupling and Q factor for various angle cuts of Lithium Tantalate over different thicknesses of a silicon dioxide layer.
Figure 12B:
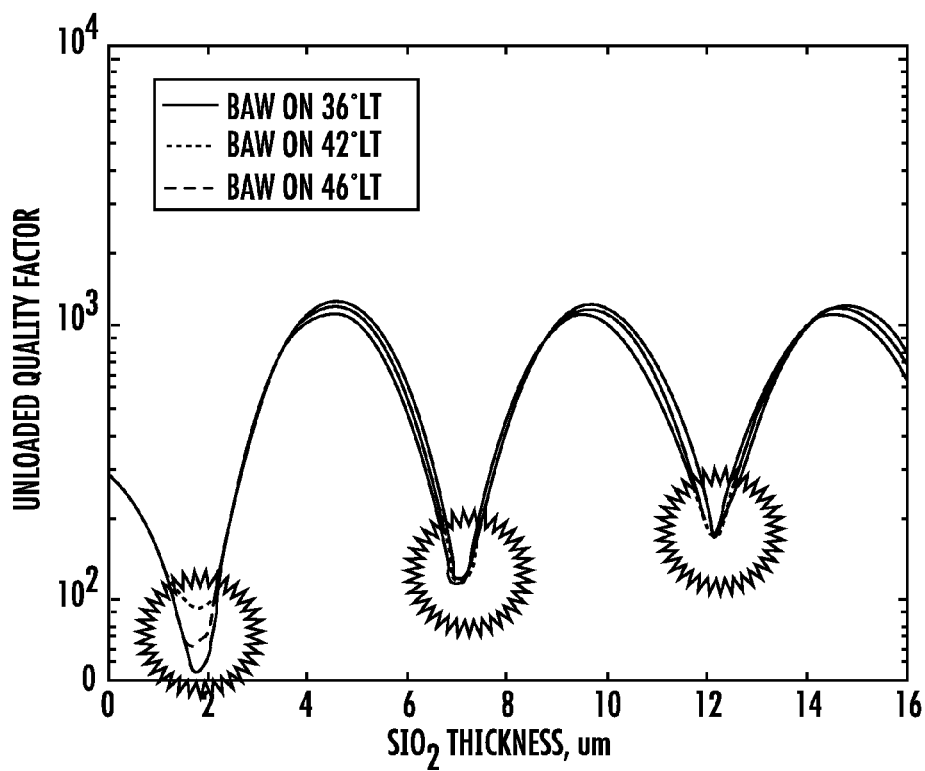
Figure 13A:
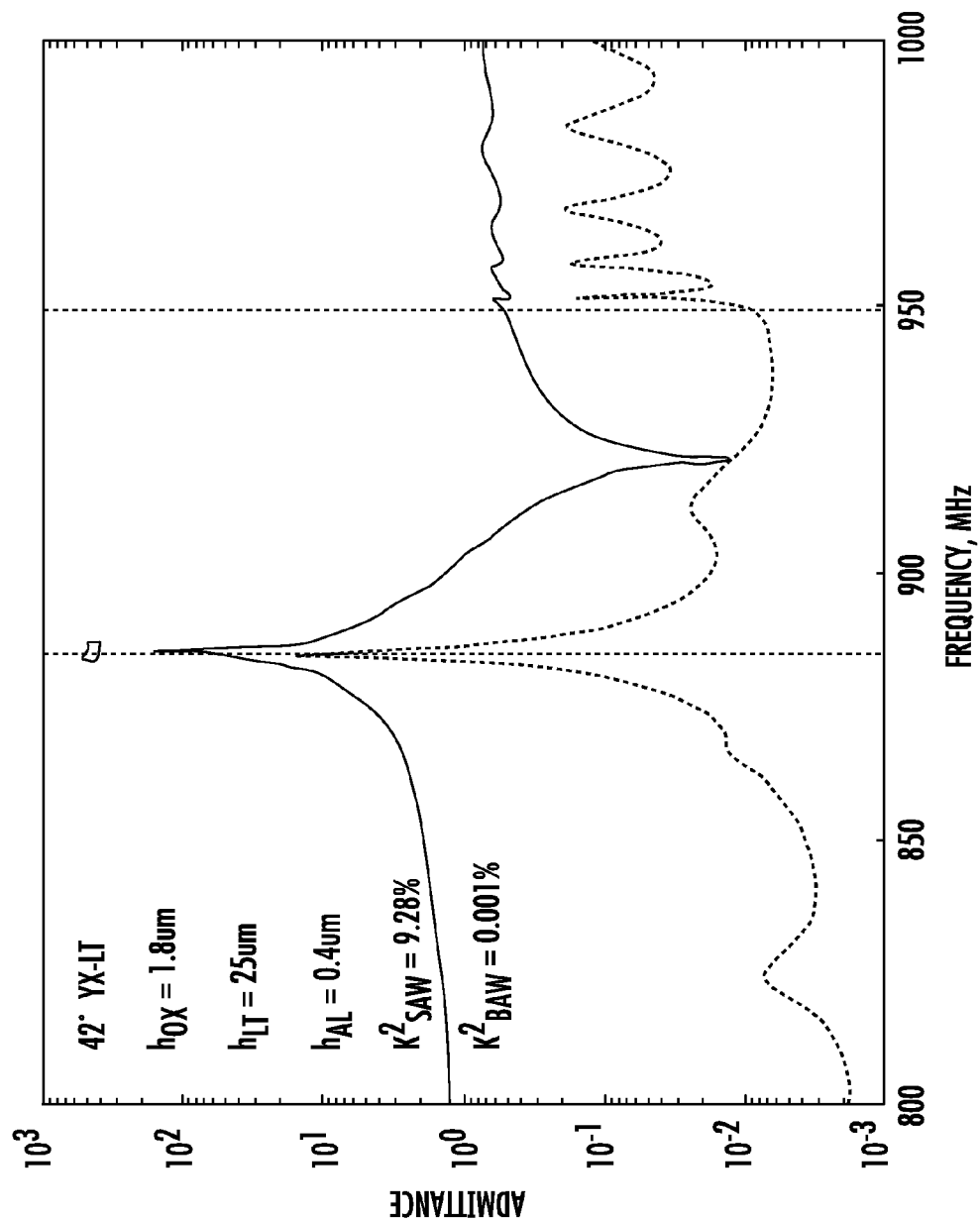
FIGS. 13*a* and 13*b* illustrate a resonator response of one preferred embodiment for a 42° and 46° cut angle of Lithium Tantalate, respectively.
Figure 13B:
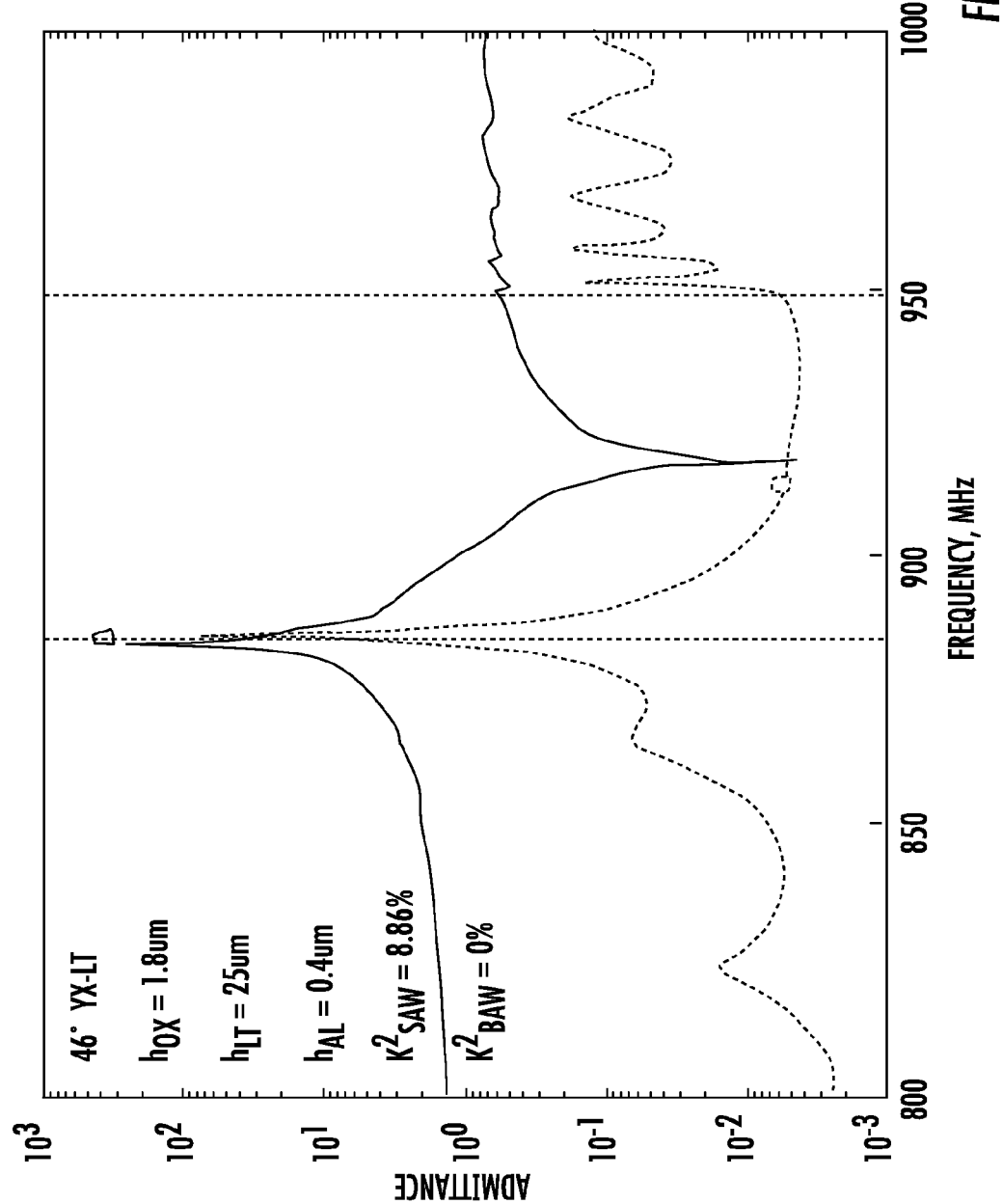

By way of example, FIGS. 12a and 12b provide simulation results of a vertical shear BAW coupling and Q factor for various cut angles of LT over different thicknesses of the silicon dioxide layer. The minimums in the coupling and Q factors are representative of the silicon thicknesses where the combinations of reflections at each interface of the silicon dioxide are destructive. When the reflections combined destructively both the effective coupling factor and the Q factor is reduced. The result for a 900 MHz SAW filter resonator shows a substantial reduction in spurious response of the plate modes at periodic intervals of silicon dioxide thicknesses which is given as $h_{(SiO2)} \approx 1.8\mu + n*(5.2)\mu$ where n takes on zero and positive integer. FIGS. 13a and 13b illustrate a resonator response of one preferred embodiment for the 42° and 46° cut angle of LT. As illustrated, the resonator responses exhibit minimum BAW modes.

Many modifications and other embodiments of the invention will come to the mind of one skilled in the art having the benefit of the teachings presented in the foregoing descriptions and associated drawings. Therefore, it is understood that the invention is not to be limited to the specific embodiments disclosed, and that modifications and embodiments are intended to be included within the scope of the appended claims.

That which is claimed is:

1. A SAW filter comprising:
   a piezoelectric substrate having first and second opposing surfaces;
   an electrode pattern deposited on the first surface of the piezoelectric substrate;
   an anti-reflective layer directly bonded to the second surface of the piezoelectric substrate;
   a carrier substrate; and
   an adhesive layer securing the anti-reflective layer to the carrier substrate, wherein the anti-reflective layer enhances an acoustic match between the piezoelectric substrate and the adhesive layer,
   wherein a thickness of the anti-reflective layer results in a suppression of acoustic reflections, and
   wherein the anti-reflective layer has an acoustic impedance and a velocity that is generally half way between that of the piezoelectric substrate and that of the adhesive layer, thus reducing shear wave reflections.

2. A SAW filter as in claim 1, wherein the anti-reflective layer comprises a Silicon oxide layer having a thickness greater than 1.5 microns for a frequency less than 900 MHz.

3. A SAW filter as in claim 1, wherein the anti-reflective layer is a Silicon oxide layer having a thickness substantially equally to 1.8 microns+n*(5.2), where n takes on zero and positive integer for a frequency of about 900 MHz.

4. A SAW filter as in claim 1, wherein the piezoelectric substrate is at least one of lithium tantalate and lithium niobate.

5. The SAW filter as in claim 1, wherein the adhesive layer comprises at least one of a glue, a resinous material and an epoxy.

6. A SAW filter comprising:
   a piezoelectric substrate having first and second opposing surfaces;
   an electrode pattern deposited on the first surface of the piezoelectric substrate;
   an anti-reflective layer directly bonded to the second surface of the piezoelectric substrate, wherein the anti-reflective layer comprises at least one of Si, Silicon oxide and Aluminium oxide;
   a carrier substrate; and
   an adhesive layer securing the anti-reflective layer to the carrier substrate, wherein the anti-reflective layer enhances an acoustic match between the piezoelectric substrate and the adhesive layer.

7. A SAW filter as in claim 6, wherein the acoustic impedance of the anti-reflective layer is between that of the piezoelectric substrate and the adhesive layer.

8. A SAW filter as in claim 6, wherein a wave velocity in the anti-reflective layer has a value between that in the piezoelectric substrate and the adhesive layer.

9. A SAW filter as in claim 6, wherein the acoustic impedance and wave velocity of the anti-reflective layer are between that of the piezoelectric substrate and adhesive layer.

10. A SAW filter as in claim 6, wherein the anti-reflective layer comprises the Silicon oxide and has a thickness greater than 1.5 microns for a frequency less than 900 MHz.

11. A SAW filter as in claim 6, wherein the anti-reflective layer is a Silicon oxide layer having a thickness substantially equally to 1.8 microns+n*(5.2), where n takes on zero and positive integer for a frequency of about 900 MHz.

12. A SAW filter as in claim 6, wherein the piezoelectric substrate is at least one of lithium tantalate and lithium niobate.

13. A SAW filter comprising:
a piezoelectric substrate having first and second opposing surfaces;
an electrode pattern deposited on the first surface of the piezoelectric substrate;
an anti-reflective layer having opposing first and second surfaces, wherein the first surface is bonded to the second surface of the piezoelectric substrate;
a carrier substrate having a surface thereon for receiving the anti-reflective layer; and
an adhesive material securing the second surface of the anti-reflective layer to the surface of the carrier substrate, wherein a thickness of the anti-reflective layer is sufficient for enhancing an acoustic match between the piezoelectric substrate and the adhesive material,
wherein a thickness of the anti-reflective layer results in a suppression of acoustic reflections, and
wherein the anti-reflective layer has an acoustic impedance and a velocity that is generally half way between that of the piezoelectric substrate and that of the adhesive material, thus reducing shear wave reflections.

14. A SAW filter as in claim 13, wherein the anti-reflective layer comprises a Silicon oxide layer having a thickness greater than 1.5 microns for a frequency less than 900 MHz.

15. A SAW filter as in claim 13, wherein the anti-reflective layer is a Silicon oxide layer having a thickness substantially equally to 1.8 microns+n*(5.2), where n takes on zero and positive integer for a frequency of about 900 MHz.

16. A SAW filter as in claim 13, wherein the piezoelectric substrate is at least one of lithium tantalate and lithium niobate.

17. A SAW filter comprising:
a piezoelectric substrate;
a carrier substrate; and
an anti-reflective layer bonded on one side to the piezoelectric substrate and attached on an opposing side to the carrier substrate by applying an adhesive layer therebetween, wherein a thickness of the anti-reflective layer is sufficient for enhancing an acoustic match between the piezoelectric substrate and the adhesive layer,
wherein the anti-reflective layer has an acoustic impedance and a velocity that is generally half way between that of the piezoelectric substrate and that of the adhesive layer, thus reducing shear wave reflections.

18. A SAW filter as in claim 17, wherein the anti-reflective layer comprises a Silicon oxide layer having a thickness greater than 1.5 microns for a frequency less than 900 MHz.

19. A SAW filter as in claim 17, wherein the anti-reflective layer is a Silicon oxide layer having a thickness substantially equally to 1.8 microns+n*(5.2), where n takes on zero and positive integer for a frequency of about 900 MHz.

20. A SAW filter as in claim 17, wherein the piezoelectric substrate is at least one of lithium tantalate and lithium niobate.

* * * * *